United States Patent [19]
Nguyen

[11] Patent Number: 5,379,457
[45] Date of Patent: Jan. 3, 1995

[54] LOW NOISE ACTIVE MIXER

[75] Inventor: Nhat M. Nguyen, San Jose, Calif.

[73] Assignee: Hewlett-Packard Company, Palo Alto, Calif.

[21] Appl. No.: 83,449

[22] Filed: Jun. 28, 1993

[51] Int. Cl.6 .......................... H04B 1/28; G06G 7/02
[52] U.S. Cl. ..................................... 455/323; 455/326; 455/333; 327/113
[58] Field of Search ............... 455/323, 325, 326, 319, 455/320, 333; 307/529; 328/158; 330/302, 305

[56] References Cited

U.S. PATENT DOCUMENTS

| | | | |
|---|---|---|---|
| 4,080,573 | 3/1978 | Howell | 455/326 |
| 4,268,916 | 5/1981 | Kusakabe | 455/326 |
| 4,598,256 | 7/1986 | Kinkel | 330/302 |
| 4,928,314 | 5/1990 | Grandfield et al. | 455/319 |

FOREIGN PATENT DOCUMENTS 868995 5/1961 United Kingdom.
2243965 11/1991 United Kingdom.

OTHER PUBLICATIONS

*IEEE Journal of Solid State Circuits*, "Si IC-Compatible Inductors and LC Passive Filters," Nhat M. Nguyen and Robert G. Mayer, vol. 25, No. 4, Aug. 1990.
*1989 IEEE MTT-S Diget*, "Silicon Bipolar Double Balanced Active Mixer MMIC's For RF and Microwave Applications Up to 6 GHZ," Jime Wholey, Issy Kipnis, Craig Snapp.
*Communications Components-GaSa and Silicon Products, 1993 Databook*, "IAM-81008 MagIC TM Silicon Bipolar MMIC 5 GHz Active Double Balanced Mixer-/IF Amp", 8-35-8-38.

*Primary Examiner*—Curtis Kuntz
*Assistant Examiner*—Mark D. Wisler

[57] ABSTRACT

In a conventional Gilbert-cell active mixer, two local oscillator matched pairs of transistors receive a local oscillator input signal and are coupled to a radio frequency matched pair of transistors which receive a radio frequency input signal. The circuit generates an intermodulated output signal at the collectors of the local oscillator matched pairs. Noise degradation is reduced over the conventional mixer by replacing the standard radio frequency emitter degeneration resistor with a reactive element, thereby reducing thermal noise. Narrow-band input matching is achieved by insertion of a series inductive element and optional parallel capacitive element in line with the radio frequency input. Thermal noise contributed to the circuit is thereby minimized while circuit linearity is preserved in the narrow frequency band of interest.

18 Claims, 2 Drawing Sheets

LOW NOISE ACTIVE MIXER

FIELD OF THE INVENTION

This invention relates to active signal mixing circuits and, more particularly, to a double-balanced Gilbert-cell based active mixer with low noise performance and narrow-band input impedance matching.

BACKGROUND OF INVENTION

A mixer circuit (sometimes referred to as a "modulator") provides an output signal at a frequency or frequencies which are dependent upon the frequencies of two or more input signals.

A typical wide-band double-balanced mixer has two matched differential pairs of transistors which are biased by an appropriate biasing circuit. These differential pairs are base-coupled to a local oscillator input and are emitter-coupled to the two transistors of a third differential pair. This pair is base-coupled to a radio frequency input. Typically the output is taken from the collectors of the two initial differential pairs, either single-ended or differential.

It has been observed in balanced active mixing circuits that there exists a significant noise degradation within the circuit of typically 16 decibels (dB). Noise reduction in mixing circuits is a frequently sought-after but frequently elusive goal.

Since many present high frequency radio communication systems are narrow-band in nature, it would be preferable for these applications to trade off the wide-band and high noise degradation characteristics of the typical active mixer circuit for a circuit topology which maintains all the characteristics of a conventional active mixer in the frequency band of interest but which is capable of delivering the desired performance with a significantly reduced level of undesirable noise.

SUMMARY OF THE PRESENT INVENTION

The present invention provides a low noise, impedance matched double-balanced active mixer which retains all of the advantages of a conventional double-balanced active mixer over a narrow band of input frequencies, yet exhibits significantly lower noise degradation than a conventional active mixer.

The circuit includes three matched differential pairs of transistors, two of which are appropriately biased and coupled to a local oscillator input. Each of these pairs is emitter-coupled to one of the transistors of the third differential pair, which is biased by an appropriate biasing circuit and base coupled to a radio frequency input.

The typical double-balanced active mixer effects emitter degeneration by way of a simple degeneration resistor coupling the emitters of the radio frequency differential pair. The degeneration resistor is used to improve circuit linearity which improves with a larger resistance, but larger values of resistance coupling the emitters increase the amount of thermal noise in the circuit. The present invention therefore employs a more elegant degeneration technique than typical resistive degeneration.

The emitters of the radio frequency pair are reactively coupled. Preferably, the reactive coupling is an inductor and the input radio frequency signal is inductively coupled to the radio frequency differential pair.

BRIEF DESCRIPTION OF THE DRAWINGS

These and other features of the present invention will be better understood with reference to the following detailed description when considered in connection with the accompanying drawings wherein.

DETAILED DESCRIPTION

Figure 1:
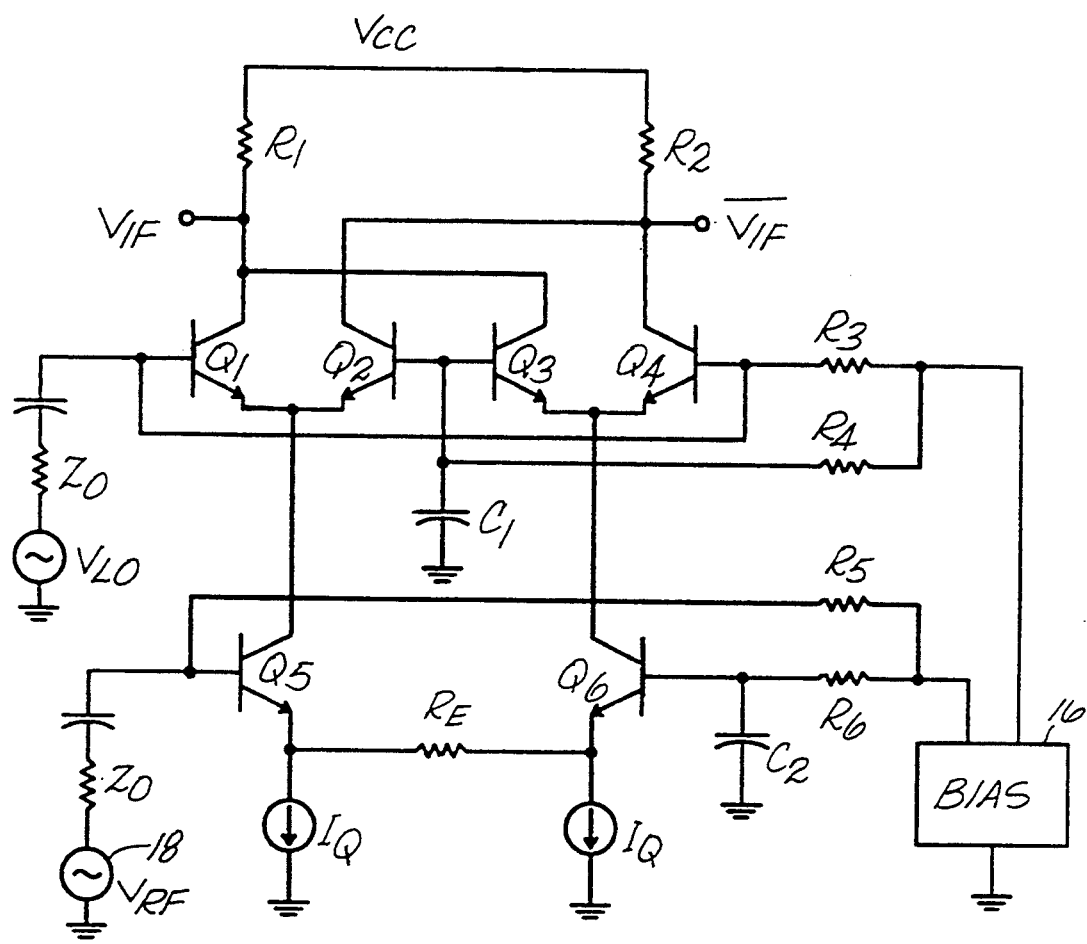
FIG. 1 is a schematic representation of a prior art conventional Gilbert-based double-balanced active mixer circuit.

Referring to FIG. 1, a typical prior art conventional double-balanced active mixer circuit generally includes a radio frequency differential pair of transistors Q5, Q6, two local oscillator differential pairs of transistors Q1, Q2, Q3, Q4, and a biasing circuit 16 coupled to the three differential pairs of transistors. A single-ended radio frequency input 18 is coupled to the bases of the two transistors of the radio frequency differential pair Q5, Q6. A single-ended local oscillator input is coupled to the bases of one of the transistors of the two local oscillator differential pairs of transistors Q1, Q4, while the bases of the other transistors of the local oscillator differential pairs Q2, Q3 are coupled together and through a capacitor C1 to ground.

The bias circuit is coupled to the three differential pairs of transistors through biasing resistors R3, R4, R5 and R6. A resistor R1 couples a supply voltage VCC to the collectors of one transistor of each local oscillator matched pair of transistors Q1 and Q3 which are tied together. Similarly a resistor R2 couples between VCC and the collectors of the other two transistors of the local oscillator matched pair Q2 and Q4 which are also tied together.

In the conventional prior art configuration the radio frequency differential pair comprises the transistors Q5, Q6, and bias resistors R5 and R6 and additionally includes a degeneration resistor RE coupled between the emitters of Q5 and Q6. The transistors of the radio frequency differential pair are driven by equal currents provided by the two current sources, IQ. This radio frequency portion of the circuit is used for providing an input impedance matched to the source impedance $Z_0$ of typically 50 $\Omega$ or 75 $\Omega$. Impedance matching is desirable when the incoming radio frequency signal is at a high frequency (greater than approximately 100 megahertz). Since the impedance looking into the base of Q5 is relatively high compared to the source impedance $Z_0$, the input matching is normally achieved by having the bias resistor R5 equal the source impedance $Z_0$. This brute-force approach, while allowing wide-band matching degrades the noise figure of the circuit by up to 3 decibels (dB).

Additionally, the radio frequency differential pair is used to linearize the input stage by use of the emitter degeneration resistor RE. A large degeneration resistor causes improvements in the circuit's linearity, but as the value of RE increases it contributes a greater amount of thermal noise to the circuit. A typical noise figure for this mixer topology is about 16 decibels (dB).

From the above discussion, it is apparent that the brute-force technique for input matching and the resistive feedback degeneration technique for linearity degrade the noise figure and consequently the dynamic range of the circuit. Since many modern high frequency communication systems are narrow band in nature and require mixer circuits of lower noise figures, one would prefer a mixer topology that maintains all the essential characteristics of a conventional mixer in the frequency band of interest but with a better noise performance. One technique is presented by the present invention.

Figure 2:
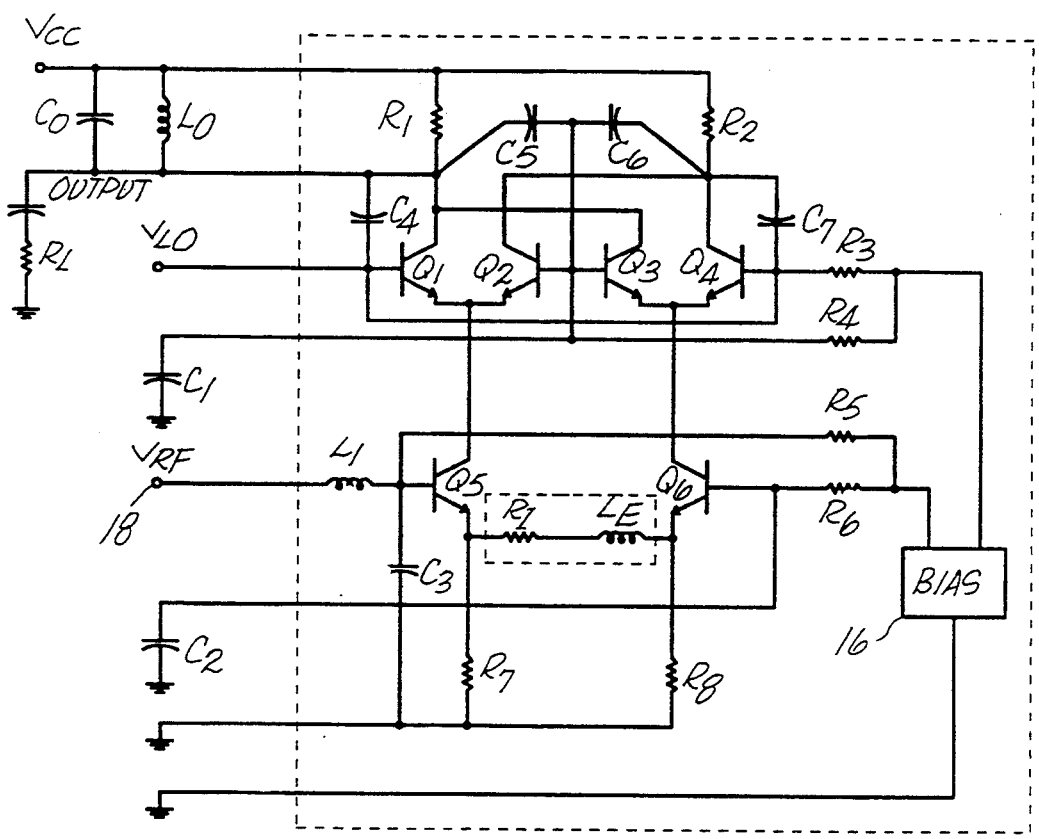
FIG. 2 is a schematic representation of a lower-noise impedance-matched double-balanced active mixer according to the present invention.

Referring now to FIG. 2, it is seen that the present invention includes essentially all of the heretofore mentioned elements of a conventional Gilbert-cell active mixer. A primary manner in which the present invention improves upon the conventional prior art circuit is by implementing a reactive feedback between the emitters of the radio frequency differential pair of transistors Q5, Q6. In the preferred embodiment the means for reactive feedback comprises a thin film spiral inductor which can be modeled as an inductor in series with a resistor RI, with the resistance being due to the metal lines of the spiral inductor. In addition, an input inductor L1 is added between the radio frequency input and the base of one of the radio frequency transistors Q5. The spiral inductor between the emitters of the radio frequency differential pair of transistors in conjunction with the input inductor L1 help to achieve input impedance matching between the radio frequency input and the radio frequency differential pair of transistors.

By replacing the noisy degeneration resistor by the spiral inductor and input inductor, the desired input matching is achieved without significantly degrading the noise figure of the circuit. The input matching can therefore be obtained without a need for a brute-force matching technique and hence does not unnecessarily degrade the noise figure. In addition, the spiral inductor also functions as a feedback element and thus improves the linearity of the circuit in the frequency range of interest without unnecessary degradation of the noise figure.

In the present invention the biasing resistors R5 and R6 for the radio frequency pair of transistors are now large value resistors (much greater than the input impedance) and are used only for biasing purposes.

For relatively low frequency applications (when the radio frequency input frequency is less than the transition frequency of the radio frequency differential pair transistors divided by the DC value of their transistor beta) an input capacitor C3 can be incorporated to improve the input matching since the effective impedance of the circuit is now close to the value of the biasing resistor R5.

Also, as illustrated in FIG. 2, compensation capacitors C4, C5, C6 and C7 are coupled between the various collectors and bases of the local oscillator differential pairs of transistors to improve circuit stability in the presence of parasitic package inductances which are present in an integrated circuit implementation of the invention. Compensation capacitors C4, C5, C6 and C7 are optional and not necessary for an effective implementation of the circuit, however they are preferred when there exist parasitic package inductances and operation of the invention is to be conducted within a narrow band of frequencies. Compensation capacitor C4 is coupled between the collectors of transistors Q1 and Q3 and the bases of transistors Q1 and Q4. Compensation capacitor C5 is coupled between the collectors of transistors Q1 and Q3 and the bases of transistors Q2 and Q3. Compensation capacitor C6 is coupled between the collectors of transistors Q2 and Q4 and the bases of transistors Q2 and Q3. Compensation capacitor C7 is coupled between the collectors of transistors Q2 and Q4 and the bases of transistors Q1 and Q4. Due to the narrow band nature of the circuit, these capacitors are included to improve the circuit's stability, however they do effect a slight increase in the local oscillator leakage signal to the intermediate frequency output port 68.

In summary of the preferred embodiment, a conventional Gilbert-cell active mixer is modified to include emitter degeneration inductor LE, input inductor L1, input capacitor C3, and compensation capacitors C4, C5, C6, C7. The improved mixer therefore has the following advantages over a conventional Gilbert-cell. It maintains all of the essential characteristics of a conventional Gilbert-cell mixer, namely, frequency conversion, local oscillator signal and radio frequency signal rejection and conversion gain. The circuit achieves low noise performance, which could be as low as 10 decibels (dB), due to elimination of the brute-force matching resistor and the degeneration resistor. The circuit achieves input matching over the narrow band of interest as well as input linearity through the band of interest through the use of reactive feedback. The reactive element may be either the inductor as described and disclosed in FIG. 2 or it may be implemented with minor changes with a capacitive element. The preferred embodiment also achieves stable operation even with the presence of parasitic inductances due to package leads present in integrated circuit applications.

In the preferred embodiment the improved active mixer is implemented on a single integrated circuit. Referring again to FIG. 2, the dashed lines represent the portion of the circuit which is implemented on the chip.

In considering the simplified radio frequency input stage of the conventional mixer topology shown in FIG. 1, it can be shown that at a frequency above $\omega_T/\beta_0$, where $\omega_T$ is the transition frequency and $\beta_0$ is the DC current gain, the effective impedance at the base of transistor Q5 is:

$$Z_i(j\omega) \approx 2r_b + \left(\frac{\omega_T}{j\omega} + 1\right)R_E + \left(\frac{1}{j\omega C_\pi/2}\right) \quad (1)$$

$$= (2r_b + R_E) + \frac{1}{j\omega}\left(R_E\omega_T + \frac{1}{C_\pi/2}\right)$$

From this, we observe that in order to achieve the desired input matching, the capacitive component must be tuned out and the real component must be matched to the source impedance $Z_0$. Input matching can be achieved by replacing the noisy degeneration resistor RE by an ideally noiseless inductor LE and by adding a base inductor L1 as is depicted in FIG. 2. The input impedance of Q5 then becomes:

$$Z_i(j\omega) \approx j\omega L_1 + 2r_o + \left(\frac{\omega_T}{j\omega} + 1\right)(R_E + j\omega L_E) + \quad (2)$$

$$\left(\frac{1}{j\omega C_\pi/2}\right)$$

$$= (2r_b + R_E + \omega_T L_E) +$$

$$\frac{1}{j\omega}\left(R_E\omega_T + \frac{1}{C_\pi/2} - \omega^2(L_1 + L_E)\right)$$

where RI represents the resistive loss of the spiral inductor due to metal lines. From (2) we observe that with the reactive element LE replacing the resistive element RE, the input matching can be obtained without need for a brute-force matching technique and thus does not degrade the noise figure.

The reactive feedback technique of the present invention may be similarly applied in mixer circuits constructed with other transistor technologies such as MESFET and MOSFET transistor technologies, with minor appropriate adaptations of the Gilbert-cell mixer. Although only a few of the implementations of the present invention are described herein, many variations and modifications will be apparent to those skilled in the art without departing from the spirit and scope of the invention.

What is claimed is:

1. An active mixer circuit comprising:
   a first local oscillator matched pair of transistors;
   a second local oscillator matched pair of transistors having operating characteristics approximately the same as the operating characteristics of the first local oscillator matched pair;
   a radio frequency matched pair of transistors;
   means for coupling the first local oscillator pair of transistors to one of the transistors of the radio frequency pair;
   means for coupling the second local oscillator pair of transistors to the other transistor of the radio frequency pair;
   means for reactively coupling the two transistors of the radio frequency pair, said reactive coupling means comprising an inductor;
   a local oscillator input coupled to control terminals of the local oscillator pairs of transistors; and
   a radio frequency input coupled to control terminals of the radio frequency pair of transistors.

2. The active mixer circuit of claim 1 further comprising means reactively coupling the radio frequency input and control terminals of the radio frequency pair of transistors for matching the input source impedance with the impedance of the radio frequency pair of transistors.

3. The active mixer circuit of claim 2 wherein the means coupling the input and the control terminals comprises an inductor.

4. The active mixer circuit of claim 1 wherein the reactive coupling means comprises a spiral inductor.

5. The active mixer circuit of claim 1 further comprising capacitive coupling means between the collector of each transistor of each of the two local oscillator matched pairs and the bases of the transistors of the local oscillator matched pairs.

6. The active mixer circuit of claim 1 wherein:
   the first local oscillator matched pair of transistors comprises two NPN transistors that are emitter coupled;
   the second local oscillator matched pair of transistors has operating characteristics approximately the same as the operating characteristics of the first local oscillator matched pair and comprises two NPN transistors that are emitter coupled;
   the collector of the first transistor of the first local oscillator matched pair of transistors is coupled to the collector of the first transistor of the second matched pair of transistors;
   the collector of the second transistor of the first matched pair of transistors is coupled to the collector of the second transistor of the second matched pair of transistors;
   the radio frequency matched pair of transistors comprises two NPN transistors;
   the collector of the first transistor of the radio frequency matched pair of transistors is coupled to the emitters of the first local oscillator matched pair of transistors;
   the collector of the second transistor of the radio frequency matched pair of transistors is coupled to the emitters of the second local oscillator matched pair of transistors;
   each emitter of the two radio frequency transistors is coupled through a resistor to ground;
   the emitters of the radio frequency transistors are coupled to each other by a spiral inductor;
   the radio frequency input is coupled to the base of the first transistor of the radio frequency differential pair through an inductor;
   the local oscillator input is coupled to the base of the first transistor of the first local oscillator matched pair of transistors and to the base of the second transistor of the second matched pair of local oscillator transistors;
   the collector and base of the first transistor of the first local oscillator matched pair of transistors are capacitively coupled together;
   the collector of the first transistor of the first local oscillator matched pair of transistors is capacitively coupled to the base of the second transistor of the first local oscillator matched pair of transistors;
   the base of the second transistor of the first local oscillator matched pair of transistors is coupled to the base of the first transistor of the second local oscillator matched pair of transistors;
   the collector and base of the second transistor of the second local oscillator matched pair of transistors are capacitively coupled together; and
   the collector of the second transistor of the second local oscillator matched pair of transistors is capacitively coupled to the base of the first transistor of the second local oscillator matched pair of transistors.

7. An active mixer circuit comprising:
   a first local oscillator matched pair of bipolar transistors;
   a second local oscillator matched pair of bipolar transistors having operating characteristics approximately the same as the operating characteristics of the first local oscillator matched pair;
   a radio frequency matched pair of bipolar transistors;
   means for coupling the emitters of the first local oscillator pair to the collector of one of the transistors of the radio frequency pair;
   means for coupling the emitters of the second local oscillator pair to the collector of the other transistor of the radio frequency pair;
   means for inductively coupling the emitters of the two transistors of the radio frequency pair;
   a local oscillator input coupled to the bases of the local oscillator matched pairs; and a radio frequency input coupled to the bases of the radio frequency matched pair.

8. The active mixer circuit of claim 7 further comprising means reactively coupling the radio frequency input and the bases of the radio frequency pair of transistors for matching the input impedance of the radio frequency matched pair with the impedance of a signal input to the circuit.

9. The active mixer circuit of claim 8 wherein the inductive coupling means comprises a spiral inductor.

10. The active mixer circuit of claim 9 wherein the input matching means comprises an inductor.

11. The active mixer circuit of claim 10 wherein the input matching means further comprises a capacitor.

12. The active mixer circuit of claim 10 further comprising capacitive coupling means between the collector of each transistor of each of the two local oscillator matched pairs of transistors and the bases of the transistors of the local oscillator matched pairs.

13. In a conventional double-balanced Gilbert-cell active mixer comprising a matched radio frequency differential pair of transistors, the improvement comprising:

means for reactive emitter degeneration of the radio frequency pair of transistors; and reactive means for matching an input impedance of the radio frequency differential pair to an output impedance of a radio frequency input to the mixer, and wherein the emitter degeneration means includes an inductor for improving the noise performance of the Gilbert-cell active Mixer.

14. The active mixer of claim 13 wherein the impedance matching means comprises an inductor.

15. The active mixer of claim 13 wherein the emitter degeneration inductor comprises a spiral inductor.

16. The active mixer of claim 15 wherein the impedance matching inductor comprises a spiral inductor.

17. The active mixer of claim 13 further comprising two matched local oscillator differential pairs of transistors, wherein the collector of each transistor is capacitively coupled to the bases of all transistors of the local oscillator differential pairs.

18. The active mixer circuit of claim 7 further comprising capacitive coupling means between the collector of each transistor of each of the two local oscillator matched pairs of transistors and the bases of the transistors of the local oscillator matched pairs.

* * * * *

UNITED STATES PATENT AND TRADEMARK OFFICE
CERTIFICATE OF CORRECTION

PATENT NO. : 5,379,457

DATED : January 3, 1995

INVENTOR(S) : Nhat M. Nguyen

It is certified that error appears in the above-indentified patent and that said Letters Patent is hereby corrected as shown below:

On the Title page, Item 54, change the title
       from "LOW NOISE ACTIVE MIXER" to
       -- BALANCED MIXER WITH INDUCTIVE COUPLING
          BETWEEN RF INPUT TRANSISTOR PAIR EMITTERS --.

Item 56, References Cited, OTHER PUBLICATIONS,
       line 3, change "Robert G. Mayer" to
          -- Robert G. Meyer --.

line 4, change "*1989 IEEE MTT-S Diget,*" to
          -- *1989 IEEE MTT-S Digest,* --.

line 7, change "Jime Wholey," to
          -- Jim Wholey --.

line 9, change "*Communications Components-GaSa*"
          to -- *Communications Components-GaAs* --.

Column 1, line 1, change the title as follows:
       -- BALANCED MIXER WITH INDUCTIVE COUPLING
          BETWEEN RF INPUT TRANSISTOR PAIR EMITTERS --.

UNITED STATES PATENT AND TRADEMARK OFFICE
CERTIFICATE OF CORRECTION

PATENT NO. : 5,379,457
DATED : January 3, 1995
INVENTOR(S) : Nhat M. Nguyen

It is certified that error appears in the above-indentified patent and that said Letters Patent is hereby corrected as shown below:

Column 4, lines 60-68 & Column 5, line 1, change the formula as follows:

$$Z_i(j\omega) \approx j\omega L_1 + 2r_b + \left(\frac{\omega_T}{j\omega} + 1\right)(R_I + j\omega L_E) + \left(\frac{1}{j\omega C_{II}/2}\right) \quad (2)$$

$$= (2r_b + R_I + \omega_{TL_E}) + \frac{1}{j\omega}\left(R_I \omega_T + \frac{1}{C_{II}/2} - \omega^2 (L_1 + L_E)\right)$$

Column 8 line 7, change "includes" to -- comprises --.

Signed and Sealed this

Seventeenth Day of October, 1995

*Attest:*

BRUCE LEHMAN

*Attesting Officer*  *Commissioner of Patents and Trademarks*